United States Patent [19]

Tadachi

[11] Patent Number: 4,654,606
[45] Date of Patent: Mar. 31, 1987

[54] MOUNTING AND GROUND CONDUCTOR ARRANGEMENT FOR A MICROWAVE RESONANCE CIRCUIT DEVICE

[75] Inventor: Akio Tadachi, Soma, Japan
[73] Assignee: Alps Electric Co., Ltd., Japan
[21] Appl. No.: 785,794
[22] Filed: Oct. 9, 1985
[30] Foreign Application Priority Data
Oct. 9, 1984 [JP] Japan .................. 59-152945[U]
[51] Int. Cl.⁴ .................................. H03B 5/18
[52] U.S. Cl. ........................ 331/99; 331/117 D; 333/219; 333/238
[58] Field of Search ............ 331/96, 117 FE, 117 D, 331/117 R, 107 SL, 99; 333/238, 219

[56] References Cited
U.S. PATENT DOCUMENTS 4,149,127 4/1979 Murakami et al. ................. 331/96
4,331,940 5/1982 Uwano .............................. 331/99
4,357,582 11/1982 Ishihara et al. .................... 331/96
4,523,159 6/1985 Dobrovolny ................. 331/117 D X Primary Examiner—Siegfried H. Grimm
Attorney, Agent, or Firm—Guy W. Shoup

[57] ABSTRACT

A microwave resonance circuit device including plural microstrip lines provided on one side of a dielectric substrate. A dielectric resonator is mounted on the reverse side of the substrate from the microstrip lines and is disposed so as to have a coupling relation with a first one of the microstrip lines. A ground conductor is arranged on the reverse side of the substrate so as to overlap substantially one-half of the width of the first microstrip line extending in a direction away from the dielectric resonator, and to overlap entirely the other microstrip lines. A transistor is mounted on the same side of the substrate as the microstrip lines and connected therewith to form an oscillator circuit.

4 Claims, 6 Drawing Figures

4,654,606

MOUNTING AND GROUND CONDUCTOR ARRANGEMENT FOR A MICROWAVE RESONANCE CIRCUIT DEVICE

BACKGROUND OF THE INVENTION

Field of the Invention

This invention relates to a microwave resonance circuit device and, particularly, to a microwave resonance circuit device of the type wherein a dielectric resonator is coupled only to a desired microstrip line.

Description of the Prior Art

In the field of microwave resonance circuit devices, the arrangement is known in which a dielectric resonator is disposed in the vicinity of a microstrip line, as shown in FIGS. 3 and 4. A ground conductor 2 is provided on the back of a dielectric substrate 1 and on the surface there are provided microstrip lines 3, 4 and 5, a dielectric resonator 6 and a transistor 7. Therefore, besides the coupling between the dielectric resonator 6 and the mating microstrip line 3, undesirable coupling arises in connection with the other microstrip lines 4 and 5. Thus, there existed the problem that the coupling of the essential microstrip line 3 is disturbed. Further, because the ground conductor 2 is provided on the back side of the dielectric resonator 6 having a large Q (quality factor) in close relation thereto, there were the problems that the value Q becomes reduced so that the coupling of the microstrip line 3 is weakened, and the variation of the value Q resulting from temperature variation becomes large.

SUMMARY OF THE INVENTION

In order to overcome the foregoing problems of the prior art, the present invention proposes to mount a dielectric resonator on the reverse side of a dielectric substrate from the surface on which microstrip lines are provided and to maintain the coupling only between the dielectric resonator and the desired microstrip line, while keeping large the value Q. That is, the microwave resonance circuit device according to the present invention is of the type wherein the microstrip lines and dielectric resonator are mounted on the dielectric substrate, and is characterized in that it comprises a first microstrip line provided on one side of a dielectric substrate, a dielectric resonator mounted on the reverse side from the first microstrip line and disposed so as to have a coupling relation with the first microstrip line, and a ground conductor is also provided on the reverse side from the first microstrip line and arranged so that the conductor covers substantially half of the reverse side portion corresponding to the width of the first microstrip line, and extends over remaining portions away from the dielectric resonator corresponding to the portions where the other microstrip lines (which are not to be coupled to the dielectric resonator) are provided.

DESCRIPTION OF THE PREFERRED EMBODIMENT

The embodiment of the present invention will be described in detail with reference to the drawings.

Figure 1:
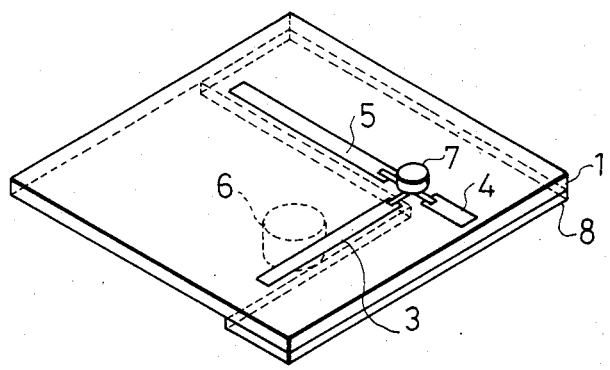
FIG. 1 is a perspective view showing the structure of an embodiment according to the present invention.
Figure 2A:
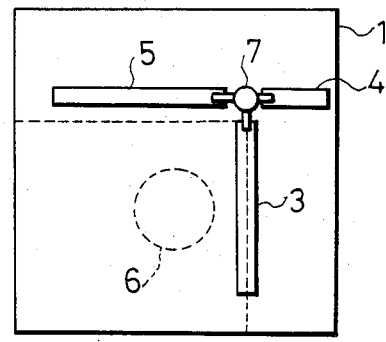
FIGS. 2(A) and (B) are a plane view and a side view of the structure of the embodiment shown in FIG. 1.
Figure 2B:
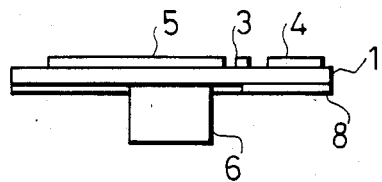
Figure 3:
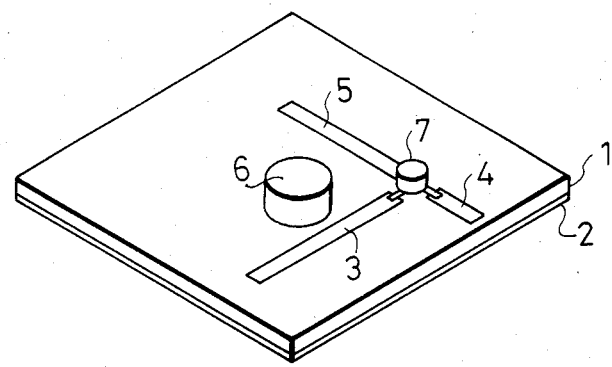
FIG. 3 is a perspective view of the conventional microwave resonance circuit device.
Figure 4A:
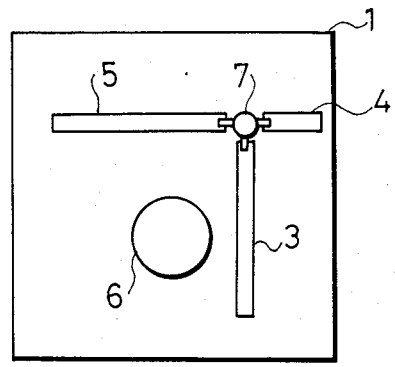
FIGS. 4(A) and (B) are a plane view and a side view of the conventional microwave resonance circuit device shown in FIG. 3.
Figure 4B:
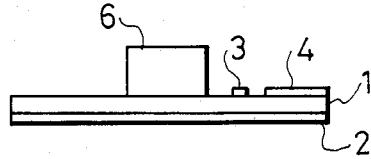

In FIGS. 1 and 2, 1 indicates a dielectric substrate, 3, 4 and 5 indicate microstrip lines, 6 indicates a dielectric resonator, 7 indicates a transistor, and 8 indicates a ground conductor.

In FIG. 1, the dielectric resonator 6 is mounted on the reverse side of the substrate from the microstrip line 3. In order to maintain the coupling between the dielectric resonator 6 and the microstrip line 3, on the reverse side from the microstrip line 3 there is also provided the ground conductor 8, as shown in the drawing, which extends from a postion corresponding nearly to half of the width of the microstrip line 3 in the direction away from the dielectric resonator 6. Further, the other microstrip lines 4 and 5 are also provided on the first-mentioned side, and the ground conductor 8 extends so as to overlap the back of the microstrip lines 4 and 5. Thus, the coupling between these microstrip lines 4 and 5 and the dielectric resonator can be prevented from arising. In addition, because the ground conductor 8 is not formed in the vicinity of the dielectric resonator 6, the value Q of the dielectric resonator 6 does not decrease. The reasons therefore will be described in detail below.

FIGS. 2(A) and (B) are a plane view and a side view corresponding to the perspective view of FIG. 1. In these drawings, the dielectric resonator 6 is, as described hereinabove, provided on the reverse side of the dielectric substrate 1 from where the microstrip lines 3, 4 and 5 are provided, and is coupled to the microstrip line 3. Further, with respect to the microstrip lines 4 and 5, as described hereinabove, the ground conductor 8 is provided over the whole reverse side portions corresponding to where the microstrip lines 4 and 5 are mounted. With respect to the microstrip line 3 in the coupled state with the dielectric resonator 6 the ground conductor 8 is provided on the reverse side so as to cover nearly half of the portion corresponding to the width of the microstrip line 3 and to extend in the direction away from the dielectric resonator 6. The reasons for the foregoing arrangement are as follows: If the ground conductor 8 were provided over the whole reverse side portion corresponding to where the microstrip line 3 is mounted, the loop in the electromagnetic field between the microstrip line 3 and the dielectric resonator 6 is shut off by the ground conductor 8 and the coupling is weakened. Contrarily, if the ground conductor 8 were not provided at all on the whole reverse side portion where the microstrip line 3 is disposed, the microstrip line 3 does not function enough as a transmission line.

Accordingly, the coupling relation exists between the dielectric resonator 6 and the microstrip line 3, but, because the ground conductor 8 exerts a shut-off function, no coupling relation exists between the dielectric resonator 6 and the microstrip lines 4 and 5. Therefore, the dielectric resonator 6 is coupled to the microstrip line 3 and can generate a very stable microwave in combination with the transistor 7, and the microstrip lines 4 and 5 are employed to satisfy the oscillation conditions. In addition, because the ground conductor 8 is provided on the reverse side where the dielectric resonator 6 is mounted, the dielectric resonator 6 is not affected in its value Q, but can preserve its large value.

As apparent from the foregoing description, according to the present invention, the dielectric resonator is mounted on the reverse side of the dielectric substrate from where the microstrip lines are provided, and the dielectric resonator is positioned to couple surely and only with the desired microstrip line. Further, because the conductor is not provided in the vicinity of the dielectric resonator, the value Q of the dielectric resonator is not deteriorated.

While the preferred embodiment has been described, variations thereof will occur to those skilled in the art and are included within the scope of the present inventive concepts, which are delineated by the following claims.

I claim:

1. A microwave resonance circuit device of the type having a plurality of microstrip lines and a dielectric resonator mounted on a dielectric substrate, characterized in that:

a first microstrip line to be coupled to the dielectric resonator is mounted on one side of the dielectric substrate, and other microstrip lines not to be coupled to the dielectric resonator are also mounted on the one side of the substrate in operative relation to the first microstrip line;

the dielectric resonator is mounted on the reverse side of the substrate from the microstrip lines and is disposed so as to have a coupling relation with the first microstrip line, and a ground conductor is mounted on the reverse side of the substrate and is arranged in shape so as to overlap substantially one-half of the reverse side portion corresponding to the width of the first microstrip line and extends in a direction away from the dielectric resonator, and to overlap entirely the reverse side portions corresponding to the widths of the other microstrip lines.

2. A microwave resonance circuit device according to claim 1, wherein the ground conductor is shaped so as not to overlap the reverse side portion corresponding to the location of the dielectric resonator.

3. A microwave resonance circuit device according to claim 1, wherein the ground conductor is shaped so as not to overlap the reverse side portion corresponding to the vicinity around the dielectric resonator.

4. A microwave resonance circuit device according to claim 1, wherein the other microstrip lines are formed in a circuit with the first microstrip line to satisfy an oscillation condition.

* * * * *